(12) United States Patent  
Baeckler

(10) Patent No.: US 8,166,436 B1  
(45) Date of Patent: Apr. 24, 2012

(54) EARLY LOGIC MAPPER DURING FPGA SYNTHESIS

(75) Inventor: Gregg William Baeckler, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/430,757

(22) Filed: Apr. 27, 2009

Related U.S. Application Data

(63) Continuation of application No. 11/412,322, filed on Apr. 26, 2006, now Pat. No. 7,543,265.

(51) Int. Cl.  
*G06F 17/50* (2006.01)

(52) U.S. Cl. .......................... 716/116; 716/104

(58) Field of Classification Search .................. None  
See application file for complete search history.

(56) References Cited

U.S. PATENT DOCUMENTS

| | | | |
|---|---|---|---|
| 5,526,276 A | 6/1996 | Cox et al. | |
| 6,195,788 B1 | 2/2001 | Leaver et al. | |
| 6,269,467 B1 * | 7/2001 | Chang et al. | 716/1 |
| 6,289,491 B1 * | 9/2001 | Dupenloup | 716/106 |
| 6,622,287 B1 * | 9/2003 | Henkel | 716/2 |
| 6,931,612 B1 * | 8/2005 | Potkonjak et al. | 716/5 |
| 7,134,100 B2 * | 11/2006 | Ravi et al. | 716/2 |
| 7,171,633 B1 | 1/2007 | Hwang et al. | |
| 7,269,803 B2 * | 9/2007 | Khakzadi et al. | 716/3 |
| 7,299,446 B2 * | 11/2007 | He et al. | 716/18 |
| 7,337,100 B1 * | 2/2008 | Hutton et al. | 703/13 |
| 7,360,197 B1 | 4/2008 | Schleicher, II et al. | |
| 7,373,631 B1 | 5/2008 | Yuan et al. | |
| 7,437,698 B2 * | 10/2008 | Deur et al. | 716/12 |
| 7,543,265 B1 | 6/2009 | Baeckler | |
| 2002/0178432 A1 * | 11/2002 | Kim et al. | 716/18 |
| 2007/0106960 A1 * | 5/2007 | Kuo et al. | 716/1 |

OTHER PUBLICATIONS

Altera Corporation, Quartus II Software, Section III, Synthesis Manual, May 2006, Chapters 7-12.  
Altera's Stratix II Device Handbook, vols. I and II, version 4.4, Dec. 2005, revised in part May 2007, revised in part Jul. 2009, 768 pages http://www.altera.com/literature/hb/stx2/stratix2_handbook.pdf.

* cited by examiner

*Primary Examiner* — Leigh Garbowski  
(74) *Attorney, Agent, or Firm* — Weaver Austin Villeneuve and Sampson LLP

(57) ABSTRACT

Programming software defining an algorithm that provides improved power, area and frequency predictability of a logic design early in the synthesis flow process, prior to Technology Mapping, without degrading the power, speed or area of the design implementation for PLDs. The method of the algorithm involves performing a high level synthesis of the logic design to generate a netlist, performing a multilevel synthesis on the netlist to generate a gate implementation of the netlist, and performing technology mapping on the gate implementation to map the gate implementation to actual resources on the target device. During the high level synthesis of the logic design into the netlist, technology mapping is performed on a selected portion of the logic design.

19 Claims, 3 Drawing Sheets

EARLY LOGIC MAPPER DURING FPGA SYNTHESIS

CROSS-REFERENCED TO RELATED APPLICATIONS

This application is a continuation of and claims the benefit of co-pending U.S. patent application Ser. No. 11/412,322 titled "Method For Early Logic Mapping During FPGA Synthesis", filed on Apr. 26, 2006, which is incorporated herein by reference in its entirety for all purposes.

FIELD OF THE INVENTION

The present invention generally relates to programmable logic devices, and more particularly, to the programmable logic design software defining a synthesis algorithm that provides improved power, area and frequency predictability of a logic design early in the synthesis flow process, prior to technology mapping.

BACKGROUND

A Programmable Logic Device (PLD) is a semiconductor integrated circuit that contains fixed logic circuitry that can be programmed to perform a host of logic functions. In the semiconductor industry, PLDs are becoming increasingly popular for a number of reasons. Due to the advances of chip manufacturing technology, application specific integrated circuits (ASICs) designs have become incredibly complex. This complexity not only adds to design costs, but also the duration of time needed to develop an application specific design. To compound this problem, product life cycles are shrinking rapidly. As a result, it is often not feasible for original equipment manufacturers (OEMs) to design and use ASICs. OEMs are therefore relying more and more on PLDs. The same advances in fabrication technology have also resulted in PLDs with improved density and speed performance. Sophisticated programming software enables complex logic functions to be rapidly developed for PLDs. Furthermore, logic designs generally can also be easily migrated from one generation of PLDs to the next, further reducing product development times. The closing of the price-performance gap with ASICs and reduced product development times makes the use of PLDs compelling for many OEMs.

Most PLDs contain a two-dimensional row and column based architecture to implement custom logic. A series of row and column interconnects, typically of varying length and speed, provide signal and clock interconnects between blocks of logic on the PLD. The blocks of logic, often referred to by such names as Logic Elements (LEs), Adaptive Logic Modules (ALMs), or Complex Logic Blocks (CLBs), usually include one or more look up table (LUTs), registers for generating registered logic outputs, adders and other circuitry to implement various logic and arithmetic functions.

The programming software is used to develop a logic design that is to be implemented on the PLD device. The design flow of a typical programming software package generally includes design entry, synthesis, place and route, timing analysis, simulation and finally the configuration of the PLD device. A user will typically enter a logic design using a high level language such as Verilog or VHDL. Once the logic design has been entered, a gate level netlist is extracted from Verilog or VHDL. In the synthesis step, the netlist is broken down and implemented into the actual hardware resources available on the PLD device. The place and route module arranges the necessary hardware resource to implement the design on the device as efficiently as possible. Thereafter, the design is simulated and timing analysis is performed. Any modifications to the design to meet timing or performance specifications are typically identified and corrected at this stage. Once the design is finalized, the programming software next converts the output of the place and route module into a programming file. The programming contains the individual bits used to configure or program the hardware on the PLD to implement the intended logic design on the device.

The synthesis module of the programming software includes a number of modules. In a first stage called Register Transfer Language (RTL) or High Level Synthesis, the logic as defined by the gate level netlist is simplified. For example, a gate level netlist expression A+B+0 is simplified to A+B. In the next module called Multi Level Synthesis (MLS), the netlist defined by the High Level Synthesis module is reduced into an actual gate implementation using basic logic gates such as AND, OR, XOR, registers, etc. Finally, in a Technology Mapping (TM) step, the actual gate implementation as defined by the MLS module is mapped into the available hardware resources on the PLD, such as Look Up Tables, Logic Array Blocks, Memory Array Blocks, DSP blocks, etc. The output of the TM module is provided to the place and route module of the programming software.

There is a problem with the synthesis modules of currently known programming software packages. By the time the design is synthesized in the Technology Mapping stage, the power, area and maximum clock frequency (fmax) which the design can operate is predictable. If the power, area and/or fmax parameters for a given design are not acceptable or less than ideal, however, there is very little that can be done to remedy the problem. Generally speaking, the synthesis of the design at the Technology Mapping stage is too far along to implement any meaningful changes that would significantly impact or improve the power, area or fmax of the design.

Programming software defining an algorithm that provides improved power, area and frequency predictability of a logic design early in the synthesis flow process, prior to Technology Mapping, without degrading the power, speed or area of the design implementation for PLDs is therefore needed.

SUMMARY OF THE INVENTION

Programming software defining an algorithm that provides improved power, area and frequency predictability of a logic design early in the synthesis flow process, prior to Technology Mapping, without degrading the power, speed or area of the design implementation for PLDs is disclosed. The method of the algorithm involves performing a high level synthesis of the logic to generate a netlist, performing a multilevel synthesis on the netlist to generate a gate implementation of the netlist; and performing technology mapping on the gate implementation to map the gate implementation to actual resources on the target device. During the high level synthesis of the logic into the netlist, technology mapping is performed on a selected portion of the logic to improve the predictability of the power, area and/or frequency of the logic design without substantially degrading the performance of the power, area and frequency of the logic design.

BRIEF DESCRIPTION OF THE DRAWINGS

The invention may best be understood by reference to the following description taken in conjunction with the accompanying drawings, which illustrate specific embodiments of the present invention.

It should be noted that like reference numbers refer to like elements in the figures.

DETAILED DESCRIPTION OF SPECIFIC EMBODIMENTS

Figure 1A:
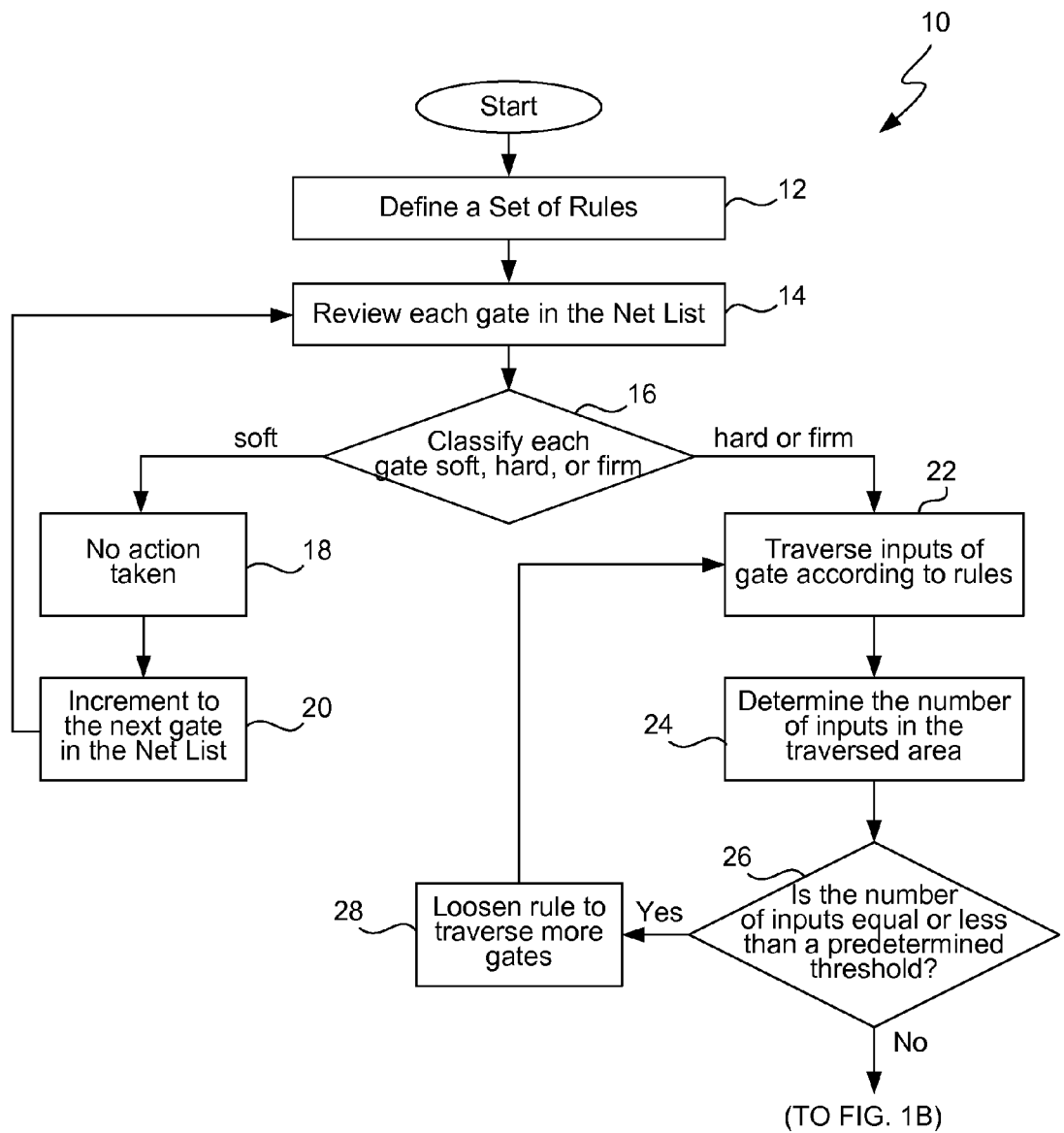
FIGS. 1A and 1B are flow diagrams illustrating the sequence of the present invention.

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

The present invention is related to a logic synthesis algorithm that improves the power, area and frequency predictability of a logic design early on during the High Level Synthesis, prior to Technology Mapping, without degrading the power, speed (Fmax) or area of the final design implementation. The High Level Synthesis algorithm involves a set of rules that identify situations where logic can be converted or mapped directly to technology or logic cells without the loss of power, speed (Fmax) or area of the final design implementation. The conversion makes the power, speed or area properties of the final implementation easier to accurately estimate. The tradeoff of the algorithm, however, is that the mapped logic cannot be subject to any further logic minimization steps. Accordingly, the set of rules specifies logic that is not likely to benefit from further minimization to improve predictability without a loss of quality. In this manner, the power, area and frequency predictability of a logic design in the High Level Synthesis stage of the overall synthesis process flow can be improved without degrading the power, speed (Fmax) or area of the final design implementation. In contrast with prior known programming software packages, the level of predictability with regard to power, speed (Fmax) and/or area is not known until later on during synthesis during Technology Mapping.

Prior to describing the logic synthesis algorithm of the present invention in detail, it is useful to provide definitions for a number of terms provided in the present application. For the purposes of the present application, the terms listed below are defined as follows:

(a) "hard source" or "hard destination" is hardware resources on the device that perform functionality that cannot be implemented or absorbed into a Look Up Table (LUT). For example, RAM, I/O pins, multiplier circuits, DSP blocks, etc. are all examples of circuitry that cannot be implemented in a LUT. The term "source" means the origination point and "destination" means the location or place where the signal is being applied.

(b) a "hard signal" is a signal derived from or outputted by a hard source.

(.c) "firm source" is the output signal of a LUT used to drive a hard destination. In other words, a firm source is a source that is required to be implemented in one or more LUTs. A firm source can also be merged with other destination logic.

(d) a "firm signal" is a signal derived from or outputted by a firm source.

(e) a "soft signal" is a signal that is not hard or firm.

(f) "volume" is the amount of computation in terms of gate input and output terms which is included in a logic function, bounded by a specific input and output points. For example, a circuit with a first 2-input AND gate driving a second 2-input AND gate has a volume of two 2-input AND gates. Volume can be measured in alternative metrics such as interconnect, transistors, minterms, etc. The selection of a particular volume metric is not critical to the algorithm behavior on most PLD devices.

(g) "cone" is an output signal and one or more gates that generates the signal.

(h) "technology cell" is the native logic building block of the programmable logic device. Historically, the technology cell in most known programmable logic devices has been a four-input LUT, a register and glue logic. More recently though, programmable logic devices having more sophisticated technology cells, including for example, fracturable six-input LUTs, a register and glue logic. For more details on fracturable LUTs, see for example Altera's Stratix II Device handbook, Volume 1 (version 4.0, December 2005), incorporated by reference herein for all purpose.

Figure 1B:
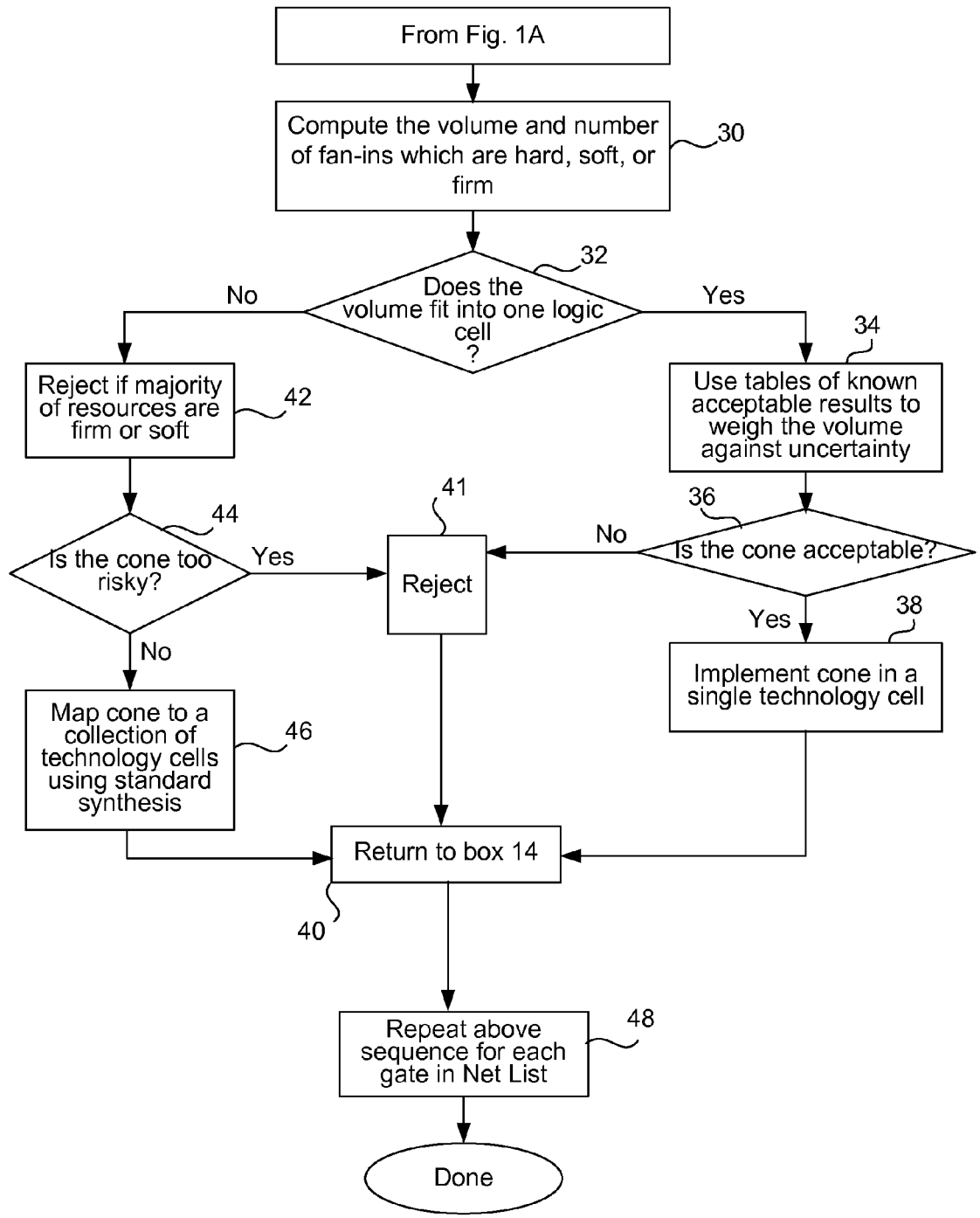

Referring to FIGS. 1A and 1B, a flow diagram 10 illustrating the sequence of the logic synthesis algorithm of the present invention is shown.

In the initial step 12, a set of rules are defined for performing the technology mapping during High Level Synthesis. The set of rules include: (i) stop traversing at soft sources in the logic design with only one destination; (ii) stop traversing at soft sources in the logic design generated by a gate that has only hard and firm sources; (iii) stop traversing at any soft source; and (iv) stop traversing at in the logic design any soft sources or firm sources with less than a predetermined threshold number of fan-outs.

In the next step 14, each gate in the netlist is successively reviewed. In decision diamond 16, each gate is classified as being either soft, hard or firm. If a particular gate is classified as being soft, then no action is taken (box 18) and the process is incremented to the next gate in the next list (box 20) and the process repeated with the next gate.

On the other hand, if a gate is classified as being either hard or firm, then the inputs to the gate is traversed in accordance with the rules (22). During the traversing, the number of inputs to the gate is counted (box 24). In decision diamond 26, the number of traversed inputs is compared to a predetermined threshold. If the counted inputs exceed the predetermined threshold, then the volume and number of fan-ins which are hard, soft and firm within the traversed area are computed (box 30). During the computation, hard sources are distinguished from firm and sources. At a hard source, the traversing is automatically stopped. At either a firm or a soft source, the traversal is selectively stopped. In either case, a stoppage defines the input boundary of a cone associated with the gate. The output boundary of the gate is always the point the traversal starts from.

On the other hand, if a number of inputs as counted is less than or equals a predetermined threshold, then the rules are loosened (box 28) and the steps 24 and 26 are repeated. With this arrangement, the traversal starts with a generally conservative rule. The traversal rules are then gradually loosened with each pass to include more soft and firm sources until an expanded cone of adequate size is eventually identified. When this occurs, the volume and number of fan-ins which are hard, soft and firm within the traversed area are computed (box 30).

In decision triangle 32, it is determined if the computed volume can be fit into one technology cell or is too large and needs to be fitted into more than one technology cell.

If the volume fits into a single technology cell, then a table of known acceptable results to weigh the volume against uncertainties due to soft and firm sources is used (box 34). For example, if the cone has virtually all hard sources, then the cone is acceptable for being implemented in a single technology cell. As the number of soft and firm sources in the cone increases, a larger volume is necessary to be confident of acceptable power, speed and area implementation in a technology cell. In other words, by comparing a particular cone to historical data compiled into a table, it can be determined if the particular cone is acceptable (decision diamond 36). If yes, then the cone is implemented in a single technology cell (box 38) and control is returned to box 14 (box 40) and the next gate in the netlist undergoes the aforementioned process. If the cone is deemed not acceptable, then the gate is rejected (box 41) and control is returned to box 14 and the next gate in the netlist is reviewed.

If the cone is too large to fit into a single technology cell, then a separate analysis is performed. If the majority of the resources in the cone are firm or soft (i.e., not hard), then the cone is rejected (box 42). Assuming the majority of the resources are hard, the cone is reviewed to determine if it is acceptable or too risky to implement in multiple technology cells (decision diamond 44). As general rule, if the hard resources of the cone are reused by other logic cones, then the cone in question should be rejected to facilitate duplicate logic extraction (box 41). Control is then returned to box 14 where the net gate in the list undergoes the above sequence. Assuming the cone is well understood as a common standalone entity, it is mapped to the multiple technology cells using well known methods (box 46).

In a final step, the above process is repeated for each gate in the netlist (box 48). When the last of the gates in the netlist has sequenced through the process, the synthesis is complete.

Figure 2A:
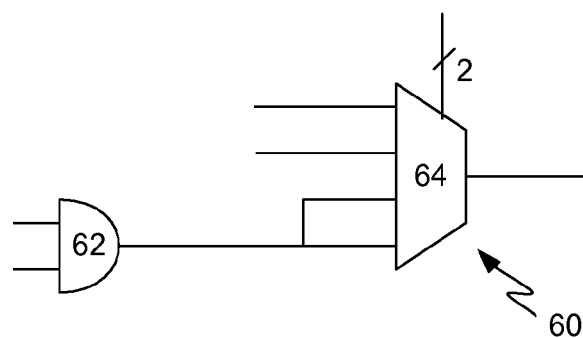
FIGS. 2A, 2B and 2C are logic circuit diagrams illustrating the present invention.
Figure 2B:
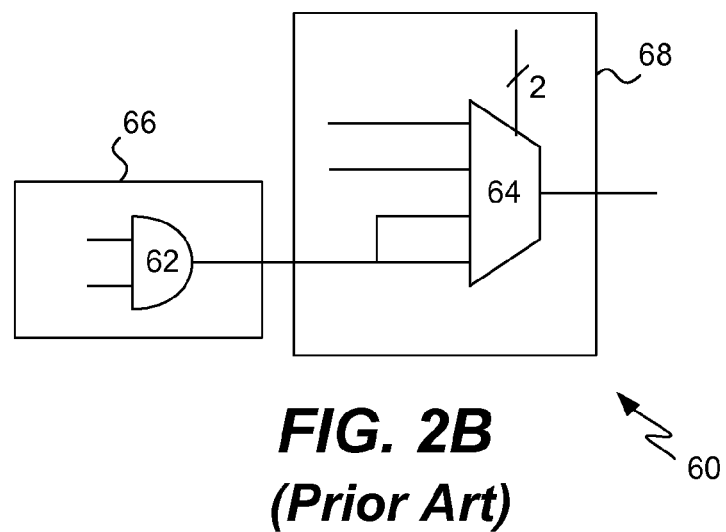
Figure 2C:
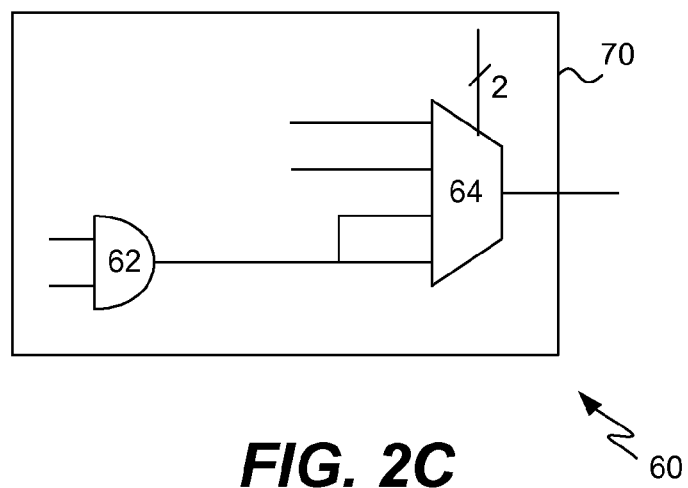

Referring to FIGS. 2A, 2B and 2C, a series of illustrations are shown for the purposes of describing the operation and advantages of the present invention. In FIG. 2A, a logic circuit 60 including an AND gate 62 feeding a MUX 64 is shown. FIG. 2B shows how the logic circuit 60 would be mapped to actual technology cells using conventional High Level Synthesis. Specifically, the AND gate 62 is mapped into a first technology cell 66 and the MUX 64 is mapped into a second technology cell 68. FIG. 2C shows how the circuit 60 is mapped into a single technology cell 70 using the high level synthesis module as described above of the present invention. With this example, the predictability of the power, area and frequency of the logic circuit 60 is achieved early in the synthesis flow process, prior to technology mapping, without degrading the power, speed or area of the design implementation. It should be noted that in the Technology Mapping stage of the synthesis, a similar or the same mapping as shown in FIG. 2C would likely result. However, there is no way to achieve the early predictability of the power, area and frequency of the logic circuit 60 using the prior art method.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A method comprising:
   receiving at a computing device a first gate-level netlist;
   generating at the computing device a second gate-level netlist during a first synthesis operation, wherein the first synthesis operation is performed during creation of a logic design, wherein the performance of the first synthesis operation includes:
      performing sequential review of a plurality of gates in the first gate-level netlist; and
      classifying gates of the plurality of gates according to whether the gates can be implemented on one or more Look Up Tables (LUTs), on hardware resources that perform functions that cannot be implemented on LUTs, or in some other manner;
   generating a gate implementation of the second gate-level netlist during a second synthesis operation; and
   mapping the gate implementation to a plurality of resources on an integrated circuit.

2. The method of claim 1, further comprising defining a set of rules for performing a second technology mapping operation during the first synthesis operation, the defined set of rules comprising: (i) performing a first traversal of the logic design; (ii) stopping the first traversal at a first set of origination points other than LUT-based and nonLUT-based origination points in the logic design, wherein origination points of the first set are associated with only one destination; (iii) performing a second traversal of the logic design; (iv) stopping the second traversal at a second set of origination points other than LUT-based and nonLUT-based origination points in the logic design, wherein the origination points of the second set are generated by a gate that has only a third set of LUT-based and nonLUT-based origination points; (v) performing a third traversal of the logic design; (vi) stopping the third traversal at a fourth set of origination points other than a LUT-based and nonLUT-based origination point; (vii) performing a fourth traversal of the logic design; and (viii) stopping the fourth traversal in the logic design at a fifth set of origination points other than LUT-based and nonLUT-based origination points or stopping the fourth traversal at a sixth set of LUT-based origination points with less than a predetermined threshold number of fan-outs.

3. The method of claim 1 wherein said performing sequential review is done during a second technology mapping operation, and wherein said classifying is performed during the second technology mapping operation.

4. The method of claim 1, further comprising sequentially incrementing to a second gate of the plurality of gates when a first gate of the plurality of gates is classified as not requiring implementation on one or more Look Up Tables (LUTs) or on hardware resources that perform functions that cannot be implemented on LUTs.

5. The method of claim 1, further comprising, for each or a subset of the gates of the plurality of gates:
   generating a first traversed area by traversing the inputs to the gate according to a predefined set of rules;
   determining a number of inputs to the gate based on the first traversed area;
   comparing the determined number of inputs to a predetermined threshold;
   responsive to said predetermined threshold exceeding said determined number of inputs, gradually loosening the predefined set of rules for generating a second traversed area until an expanded cone of adequate size is eventually identified; and responsive to said determined number of inputs exceeding said predetermined threshold, computing a volume and a number of fan-ins associated with gates classified as requiring implementation on one or more Look Up Tables (LUTs), on hardware resources that perform functions that cannot be implemented on LUTs, or in some other manner, in the traversed area and determining an input boundary of a cone associated with the traversed area.

6. The method of claim 5, further comprising determining whether the computed volume fits into one technology cell or more than one technology cell on the programmable logic device.

7. The method of claim 6, wherein the computed volume includes an expanded cone, wherein when the computed volume extends outside one technology cell, said method further comprising either:

mapping the expanded cone to a collection of technology cells using standard synthesis when the expanded cone is deemed safe; or rejecting the expanded cone when a majority of the resources in the expanded cone are firm or soft.

8. The method of claim 7, further comprising incrementing to a gate of the plurality of gates after either mapping the expanded cone to the collection of technology cells or rejecting the expanded cone.

9. The method of claim 5, wherein the computed volume includes a cone, wherein when the cone fits into one technology cell, said method further comprising:

determining whether the computed volume is acceptable; and either:
implementing the cone in a single technology cell when the cone is deemed acceptable; or
rejecting the cone when the cone is deemed to be unacceptable.

10. The method of claim 9, further comprising comparing the cone to historical data of known acceptable results.

11. The method of claim 9, further comprising incrementing to a gate of the plurality of gates after determining that the cone is acceptable or unacceptable.

12. An integrated circuit comprising:
a plurality of hardware resources; and
a plurality of connections coupling a portion of the plurality of hardware resources, wherein the plurality of hardware resources is configurable to map to a gate implementation of a first gate-level netlist, wherein the gate implementation is generated by a computing device during performance of a first synthesis operation, wherein the first gate-level netlist is generated from a second gate-level netlist during performance of a second synthesis operation, wherein the second synthesis operation is performed during creation of a logic design, wherein the second gate-level netlist includes a plurality of gates, wherein during the performance the second synthesis operation, gates of the plurality of gates are sequentially reviewed and classified according to whether the gates can be implemented on one or more Look Up Tables (LUTs), on hardware resources that perform functions that cannot be implemented on LUTs, or in some other manner.

13. The integrated circuit of claim 12, wherein the plurality of connections comprises row interconnections and column interconnections.

14. The integrated circuit of claim 12, wherein the portion comprises logic elements, wherein the logic elements comprise one or more look up tables, one or more registers, and one or more adders.

15. The integrated circuit of claim 12, wherein the second gate-level netlist is traversed with a first traversal, a second traversal, and a third traversal, wherein the first traversal is stopped at a first origination point other than a LUT-based and nonLUT-based origination point in the logic design, wherein the first origination point is associated with only one destination, wherein the second traversal is stopped at a second origination point other than a LUT-based and nonLUT-based origination point in the logic design, and wherein the third traversal is stopped at a third origination point other than a LUT-based and nonLUT-based origination point in the logic design or at a fourth LUT-based origination point, wherein the third origination point is associated with less than a predetermined number of fanouts and the fourth LUT-based origination point is associated with less than the pre-determined number of fanouts.

16. At least one computer readable storage medium having computer program instructions stored thereon that when executed perform a method comprising:

receiving at a computing device a first gate-level netlist;
generating at the computing device a second gate-level netlist during a first synthesis operation, wherein the first synthesis operation is performed during creation of a logic design, wherein the performance of the first synthesis operation includes:
performing sequential review of a plurality of gates in the first gate-level netlist; and
classifying gates of the plurality of gates according to whether the gates can be implemented on one or more Look Up Tables (LUTs), on hardware resources that perform functions that cannot be implemented on LUTs, or in some other manner;
generating a gate implementation of the second gate-level netlist during a second synthesis operation; and
mapping the gate implementation to a plurality of resources on an integrated circuit.

17. The at least one computer readable storage medium of claim 16, wherein said method further comprises, for each or a subset of the gates of the plurality of gates:

generating a first traversed area by traversing the inputs to the gate according to a predefined set of rules;
determining a number of inputs to the gate based on the first traversed area;
comparing the determined number of inputs to a predetermined threshold;
responsive to said predetermined threshold exceeding said determined number of inputs, gradually loosening the predefined set of rules for generating a second traversed area until an expanded cone of adequate size is eventually identified; and
responsive to said determined number of inputs exceeding the predetermined threshold, computing a volume and a number of fan-ins associated with gates classified as requiring implementation on one or more Look Up Tables (LUTs), on hardware resources that perform functions that cannot be implemented on LUTs, or in some other manner, in the first traversed area and determining an input boundary of a cone associated with the traversed area.

18. The at least one computer readable storage medium of claim 17, wherein said method further comprises:

determining whether the computed volume fits into one technology cell on the integrated circuit.

19. The at least one computer readable storage medium of claim 17, wherein the computed volume includes a cone, and wherein the computer program instructions are further arranged to perform the following method when the cone fits into one technology cell:

determining whether the computed volume is acceptable;

implementing the cone in a single technology cell in response to the cone being acceptable; and rejecting the cone in response to the cone being unacceptable.

\* \* \* \* \*